United States Patent [19]
Petric et al.

[11] Patent Number: 4,528,451
[45] Date of Patent: Jul. 9, 1985

[54] GAP CONTROL SYSTEM FOR LOCALIZED VACUUM PROCESSING

[75] Inventors: Paul F. Petric, Swampscott; Michael S. Foley; Mark W. Utlaut, both of Beverly; Joseph A. Laiacano, Gloucester, all of Mass.

[73] Assignee: Varian Associates, Inc., Palo Alto, Calif.

[21] Appl. No.: 435,177

[22] Filed: Oct. 19, 1982

[51] Int. Cl.³ .............. H01J 37/18; H01J 37/20; H01J 33/02
[52] U.S. Cl. .............. 250/441.1; 250/442.1; 250/442.2; 219/121 EN; 219/121 EQ; 219/121 EX; 219/121 EY
[58] Field of Search .............. 250/441.1, 442.1, 492.2; 219/121 EQ, 121 EN, 121 EX, 121 EY; 73/37.5

[56] References Cited

U.S. PATENT DOCUMENTS

| | | | |
|---|---|---|---|
| 3,156,811 | 11/1964 | Barry | 219/121 EQ |
| 3,194,055 | 7/1965 | Knobel | 73/37.5 |
| 3,388,235 | 6/1968 | Pinsley et al. | 219/121 EQ |
| 3,426,173 | 2/1969 | Steigerwald | 219/121 |
| 3,523,447 | 8/1970 | Sharp et al. | 73/37.5 |
| 4,191,385 | 3/1980 | Fox et al. | 277/3 |
| 4,213,698 | 7/1980 | Firtion et al. | 355/77 |
| 4,342,900 | 8/1982 | Susei et al. | 219/121 EN |
| 4,358,657 | 11/1982 | Steigerwald et al. | 219/121 EN |
| 4,392,642 | 7/1983 | Chitayat | 250/442.1 X |
| 4,393,295 | 7/1983 | Beisswenger et al. | 219/121 EJ |

FOREIGN PATENT DOCUMENTS 2023336A 12/1979 United Kingdom .
2027271A 2/1980 United Kingdom .

OTHER PUBLICATIONS

Saunders, "Wafer Flatness Utilizing the Pin-Recess Chuck," *Solid State Technol.*, May 1982, p. 73.
Scire et al., "Piezodriven 50 μm Range Stage with Subnanometer Resolution," *Rev. Sci. Instrum.* 49(12), Dec. 1978, p. 1735.
Lewis et al., "A Laser Interferometer Controlled X, Y Air Bearing for Direct Wafer Exposure Electron Beam Lithography," *Proc., 10th Int. Conf. on Electron and Ion Beam Science and Technology*, p. 477 (1982).
Fox, "Planar Vacuum Seal for Isolating an Air Bearing," U.S. Ser. No. 107,207, filed Dec. 26, 1979 (Corresponding PCT Application No. US80/01718, published Jul. 8, 1982.

*Primary Examiner*—Alfred E. Smith
*Assistant Examiner*—Jack I. Berman
*Attorney, Agent, or Firm*—Stanley Z. Cole; William R. McClellan

[57] ABSTRACT

Apparatus for controlling the gap between localized vacuum processing envelope apparatus and a workpiece as the workpiece, typically a semiconductor wafer, is moved laterally with respect to the envelope apparatus. The envelope apparatus includes an envelope which defines an internal vacuum processing zone and a generally planar tip spaced from the workpiece during processing by the gap. The gap control apparatus includes a gap sensor for measuring the gap, a control circuit for comparing the measured gap with a required gap and generating an error signal, and an actuating means for varying the gap in response to the error signal. The gap can be sensed by sensing the pressure level in the vacuum processing apparatus. The actuating means can include a plurality of piezoelectric actuators which can vary both the gap and the angle of the workpiece with respect to the tip of the vacuum processing apparatus. The disclosed apparatus is particularly useful in connection with particle beam systems such as electron beam lithography systems. In another embodiment, the gap is controlled by an air bearing between the envelope apparatus and the workpiece.

28 Claims, 9 Drawing Figures

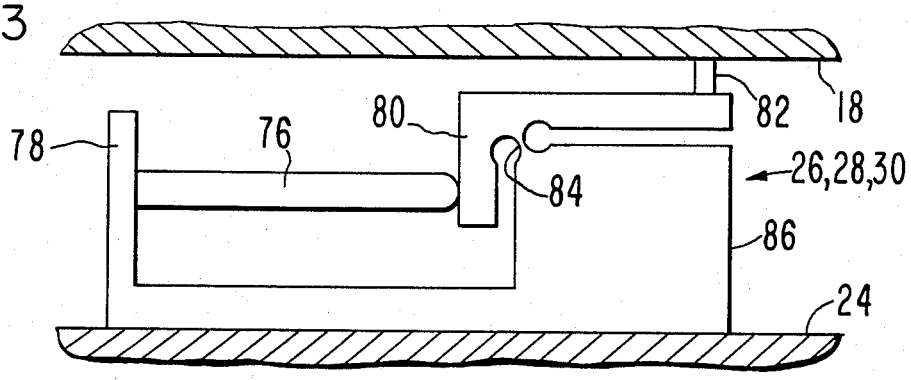
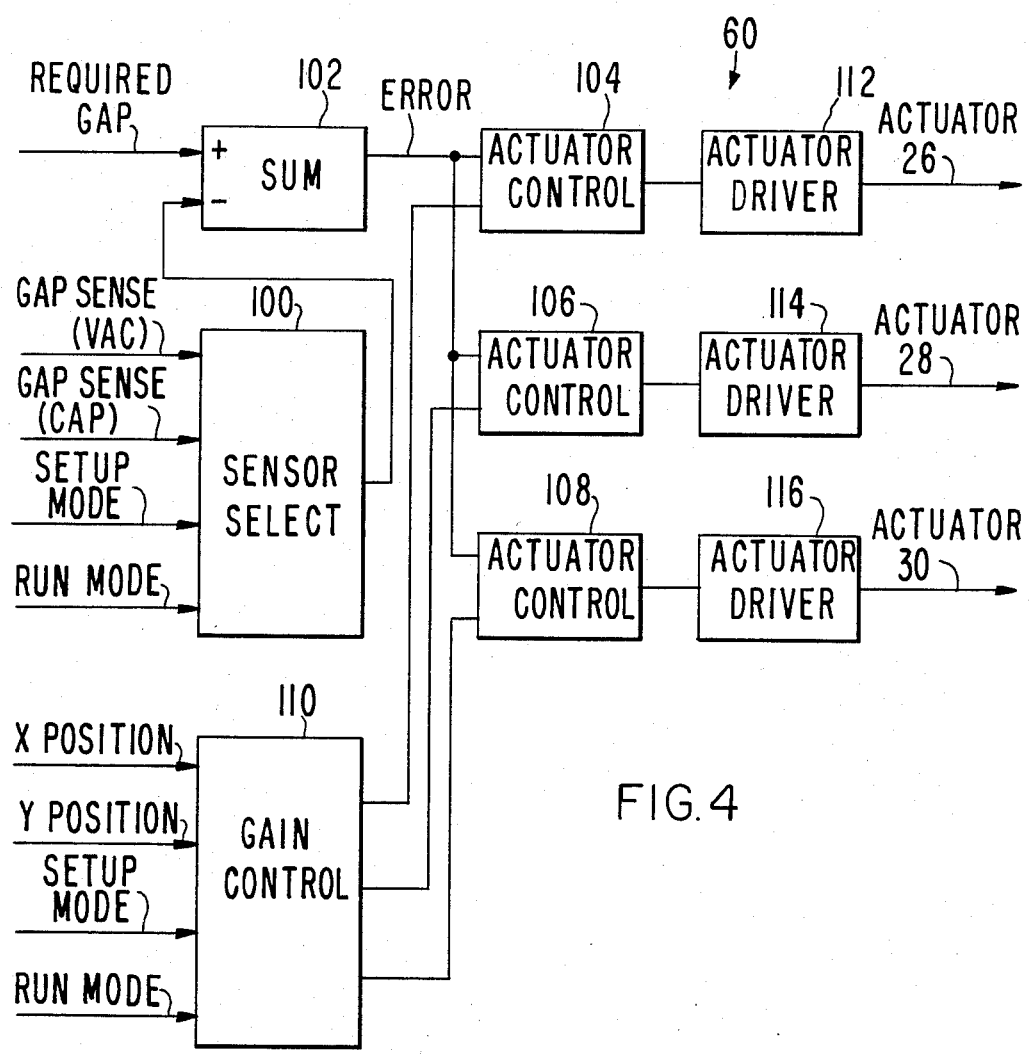

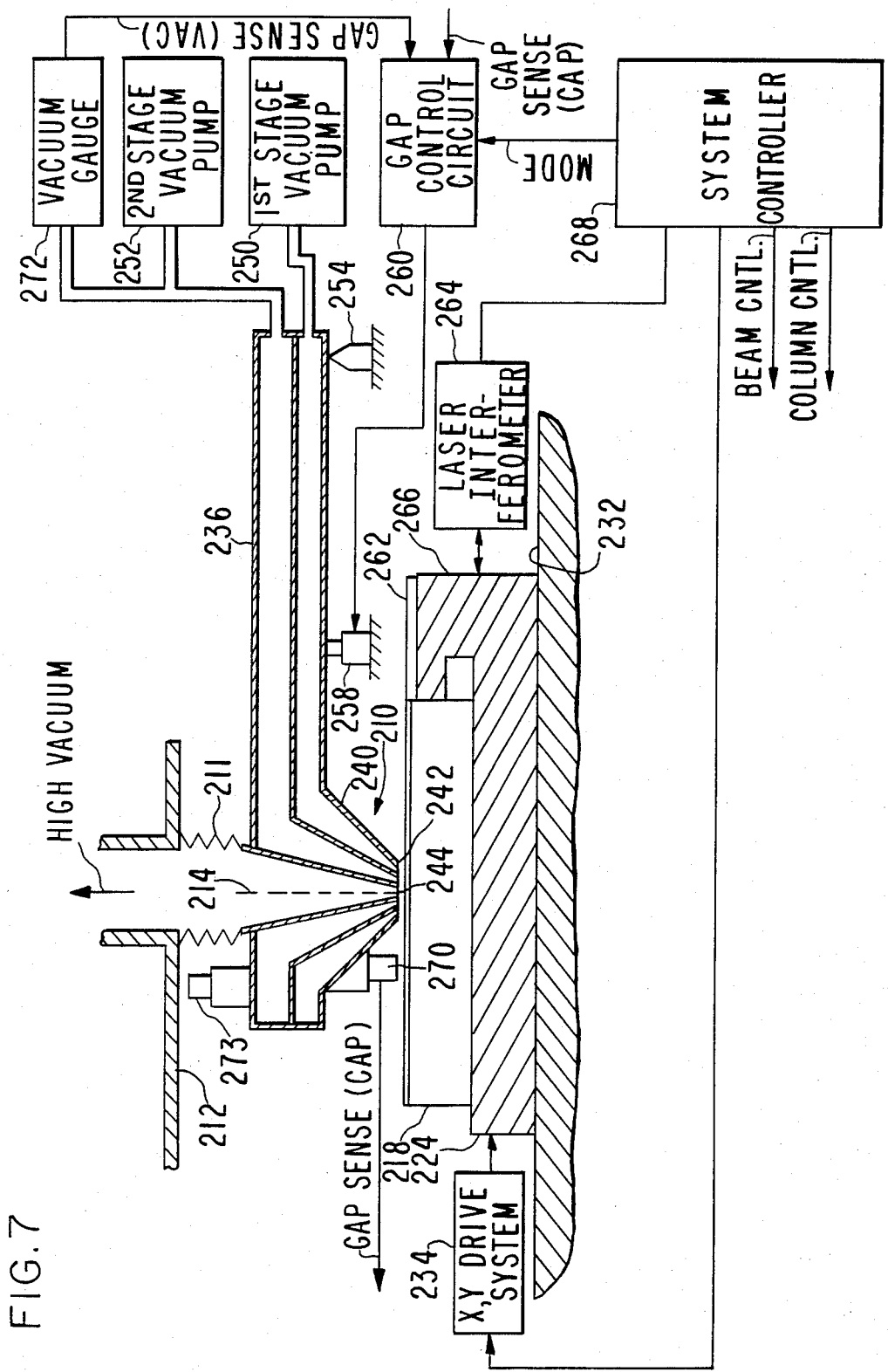

GAP CONTROL SYSTEM FOR LOCALIZED VACUUM PROCESSING

Government Rights

The Government has rights in this invention pursuant to Contract No. F19628-80-C-0173 awarded by the Department of the Air Force.

BACKGROUND OF THE INVENTION

This invention relates to vacuum processing of a workpiece and, more particularly, to systems for controlling a gap between the tip of a vacuum envelope apparatus and a surface of a workpiece in a localized vacuum processing system.

Particle beam systems, such as ion implanters, electron beam lithography systems and ion beam lithography systems, require evacuation of the region along the path between the particle beam source and the workpiece being treated. Various types of vacuum processing chambers have been used. In the simplest, workpieces are loaded either singly or in a batch into a work chamber containing the particle beam source. After loading, the chamber is sealed and is vacuum pumped until the desired level of vacuum is achieved. This approach is relatively slow, since the entire volume of the work chamber must be vacuum pumped each time a new batch of workpieces is introduced. Additional problems include outgassing of absorbed gases and introduction of contaminants. In many processes, for example, commercial semiconductor processing, throughput is of utmost importance. To increase processing speed, air locks have been used for introducing the workpiece into the processing chamber. The workpiece is introduced into a small volume which is then sealed and vacuum pumped. When the desired level of vacuum is reached, a door or valve connecting the air lock to the processing chamber is opened. The vacuum pumping time is reduced by reducing the volume to be pumped.

Certain particle beam processes, such as electron beam lithography, require movement of the workpiece during processing. In electron beam lithography, microminiature patterns of extremely high accuracy are exposed on the workpiece. To achieve high accuracy, the deflection field of the electron beam is limited to an area much smaller than the area of the workpiece. Typically, the deflection field in an electron beam system is one or a few millimeters, while the workpiece, usually a semiconductor wafer or a mask plate, can be up to several inches in dimension. Thus, precise positioning of the workpiece is required. In the past, the workpiece has been positioned by a system of drive motors external to the vacuum region and a mechanical linkage has been used to transmit the motion into the vacuum through bellows or rotary vacuum seals. Such systems have been large, complex and relatively unreliable. In spite of the size and complexity of such positioning systems, the particle beam is scanned over a very small localized region of the workpiece surface at any given time.

Apparatus for vacuum processing in a localized region on the surface of a workpiece is disclosed in pending application Ser. No. 435,179 filed concurrently herewith and assigned to the assignee of the present invention. The vacuum processing apparatus includes an envelope which defines an internal vacuum processing zone. The tip of the envelope is positioned just above the surface of the workpiece and is spaced from the workpiece by a preselected gap. The tip of the envelope together with the workpiece forms a non-contacting graded vacuum seal between the internal vacuum processing zone and the ambient environment. The envelope tip typically has the general shape of a cone and provides a vacuum zone on the surface of the workpiece which is small in comparison with the size of the workpiece.

In order to treat the entire surface of the workpiece, relative movement between the envelope and the workpiece is required. Typically, the workpiece, is mounted on a stage which is laterally movable, with respect to the tip of the envelope. To achieve rapid processing of workpieces in systems such as electron beam lithography systems, stage speeds of between 1 and 10 cm/second are typically employed. During this movement, the gap between the tip of the envelope and the workpiece must be dynamically controlled within specified limits. If the gap becomes too large, the vacuum in the vacuum zone is reduced, and processing is interrupted until the required vacuum level can again be achieved. Electron beam columns used in lithography systems must be operated in the mid to high vacuum range, and, typically, inadequate space is available to provide high conductance vacuum pumping. In such cases, the gap must be relatively small. When high conductance vacuum pumping can be provided or lower pressure can be tolerated by the process, a larger gap is permitted. Conversely, the gap cannot become so small as to risk contact between the tip of the envelope and the workpiece. A workpiece such as a semiconductor wafer is extremely fragile and can be permanently damaged or broken by such contact.

While workpieces such as semiconductor wafers are in general flat and planar, they are subject to thickness variations, surface irregularities and warping, all of which can cause gap variations during the lateral movement of the wafer. Furthermore, the stage system, which provides the lateral movement of the wafer with respect to the tip of the envelope, is subject to certain imperfections and tolerances which can cause the gap to vary as the wafer is moved. These factors make it necessary to dynamically control the gap between the tip of the envelope and the workpiece during processing.

It is, therefore, an object of the present invention to provide apparatus for controlling the gap between a localized vacuum processing envelope and a surface of a workpiece.

It is another object of the present invention to provide parallel alignment between a generally planar workpiece and the generally planar tip of a localized vacuum processing envelope.

It is yet another object of the present invention to provide a novel method for sensing the gap between a localized vacuum envelope and a workpiece.

It is still another object of the present invention to provide apparatus for controlling the gap between the tip of a localized vacuum processing envelope apparatus and a workpiece so as to prevent degradation of the vacuum level in the envelope apparatus and to prevent contact between the envelope apparatus and the workpiece.

SUMMARY OF THE INVENTION

According to the present invention, these and other objects and advantages are achieved in apparatus for controlling a gap between a localized vacuum envelope apparatus and the surface of a workpiece, as the workpiece is translated laterally with respect to the envelope apparatus. The apparatus comprises sensing means operative to provide a gap sense signal corresponding to the measured gap between the envelope apparatus and the workpiece. A control means is operative in response to the gap sense signal to provide a control signal representative of the difference between the measured gap and a required gap dimension or range of allowed dimensions. An actuating means is operative to vary the gap between the envelope apparatus and the workpiece in response to the control signal so as to reduce the difference between the measured gap and the required gap dimension or range of allowed dimensions. In a preferred embodiment, the actuating means includes three independently controlled actuators coupled through a workpiece holder to the workpiece, and the control means provides independent actuator signals to each of the actuators. The actuating means thereby has the capability to vary the gap and to vary the angle between the plane of the workpiece surface and the envelope apparatus.

According to another aspect of the invention, the localized vacuum envelope apparatus includes an envelope which defines an internal vacuum processing zone, a generally planar tip and a plurality of vacuum pumping stages. The sensing means includes pressure sensing means operative to provide a pressure reading corresponding to the pressure in one of the stages and representative of the measured gap between the tip and the workpiece.

According to yet another aspect of the invention, apparatus for localized vacuum processing of a generally planar workpiece includes a vacuum envelope apparatus as described above, means for moving the workpiece laterally with respect to the envelope apparatus and means for controlling the gap between the tip and the workpiece. The gap control means includes a source of gas under pressure coupled to a plurality of holes spaced around the periphery of the tip of the envelope apparatus. A gas bearing is formed between the tip and the workpiece and the gap is determined by the pressure of the gas.

BRIEF DESCRIPTION OF THE DRAWINGS

For a better understanding of the present invention, together with other and further objects, advantages and capabilities thereof, reference may be had to the accompanying drawings which are incorporated herein by reference and in which:

FIG. 3 illustrates a preferred embodiment of an actuator in the system of FIG. 2;

FIG. 4 is a block diagram of the gap control circuit shown in FIG. 2;

FIG. 7 is a schematic block diagram illustrating yet another embodiment of gap control apparatus in accordance with the present invention.

DETAILED DESCRIPTION OF THE INVENTION

Figure 1:
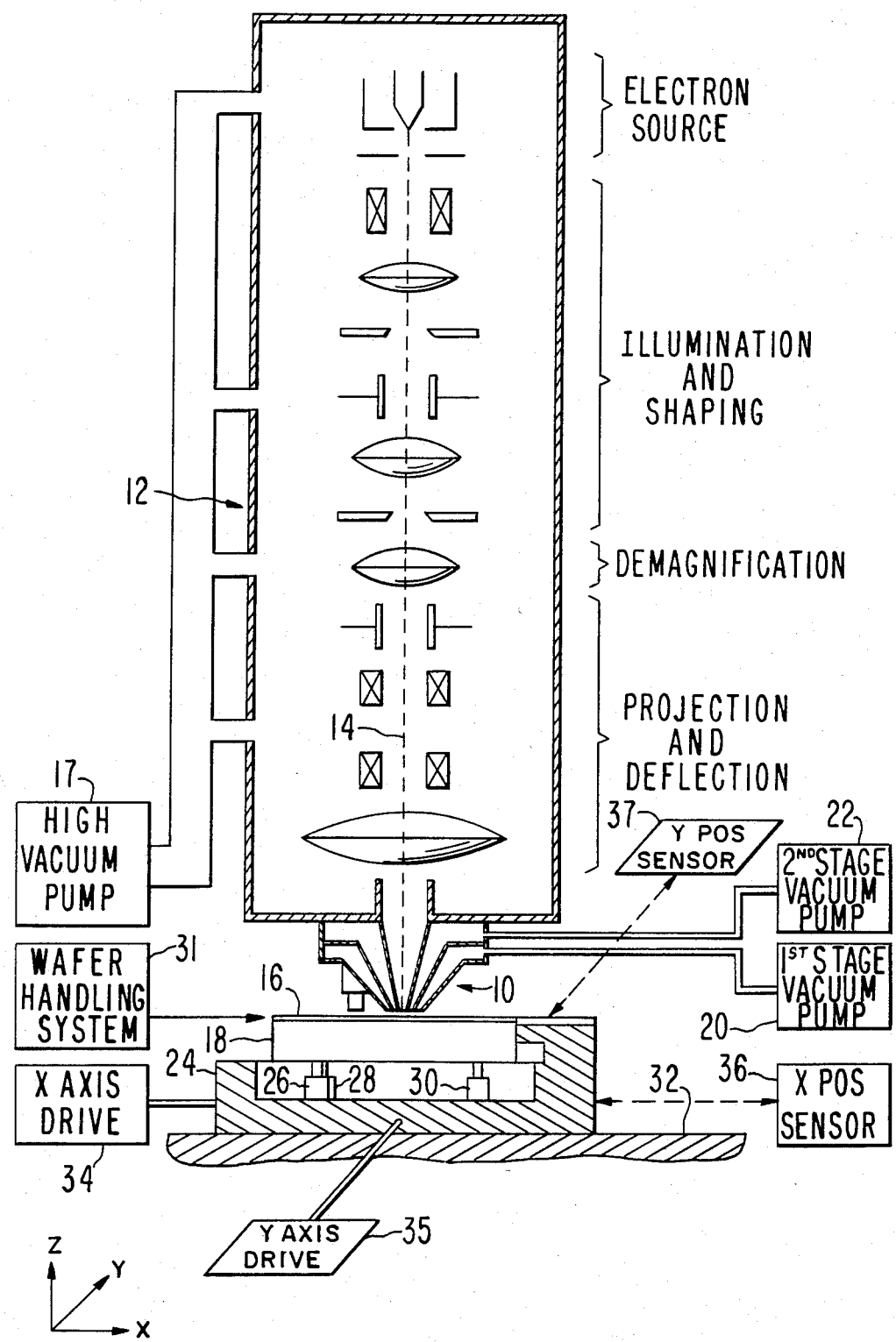
FIG. 1 is a schematic block diagram of an electron beam exposure system incorporating apparatus in accordance with the present invention.

Particle beam apparatus incorporating localized vacuum processing of a workpiece is illustrated in block diagram form in FIG. 1. An electron beam lithography system includes a localized vacuum envelope apparatus 10 mounted to the output of an electron beam column 12 which includes an electron source, illumination and shaping optics, demagnification optics and projection and deflection optics. A preferred electron beam column 12 is described in U.S. Pat. No. 4,469,950. Other suitable electron beam columns are known in the art. The output of the column 12 is a finely focused electron beam 14 which passes through the envelope apparatus 10 and impinges on a workpiece such as a semiconductor wafer 16. The entire region traversed by the electron beam 14 between the electron source and the wafer 16 is maintained at high vacuum, on the order of $10^{-6}$ Torr, by a high vacuum pump 17 coupled to the column 12. It will be understood by those skilled in the art that in a practical system, the electron optical elements are located outside the vacuum region and a central tube traversed by the electron beam 14 is maintained at high vacuum. The envelope apparatus 10 is coupled to a first stage vacuum pump 20 and to a second stage vacuum pump 2. The wafer 16 is supported and held in position by a vacuum chuck 18 which is supported above a movable stage 24 by actuators 26, 28, 30 and a flexible ring. Wafers are placed on the vacuum chuck 18 and removed therefrom by an automated wafer handling system 31. The stage 24 is movably supported on a planar surface 32 by an air bearing and is translated over the surface 32 by an x-axis drive system 34 and a y-axis drive system 35. The position of the stage 24 and the wafer 16 on the plane 32 is sensed by an x position sensor 36 and a y position sensor 37, which are typically laser interferometers. It will be understood that the x and y axes define the plane 32 while the z-axis coincides generally with the path of the electron beam 14. The complete electron beam lithography system further includes a controller, or computer and associated electronic system (not shown in FIG. 1), which controls the column 12, the drive system 34, 35, the vacuum system and the wafer handling system 17 and which stores pattern data and provides beam control signals.

Figure 2:
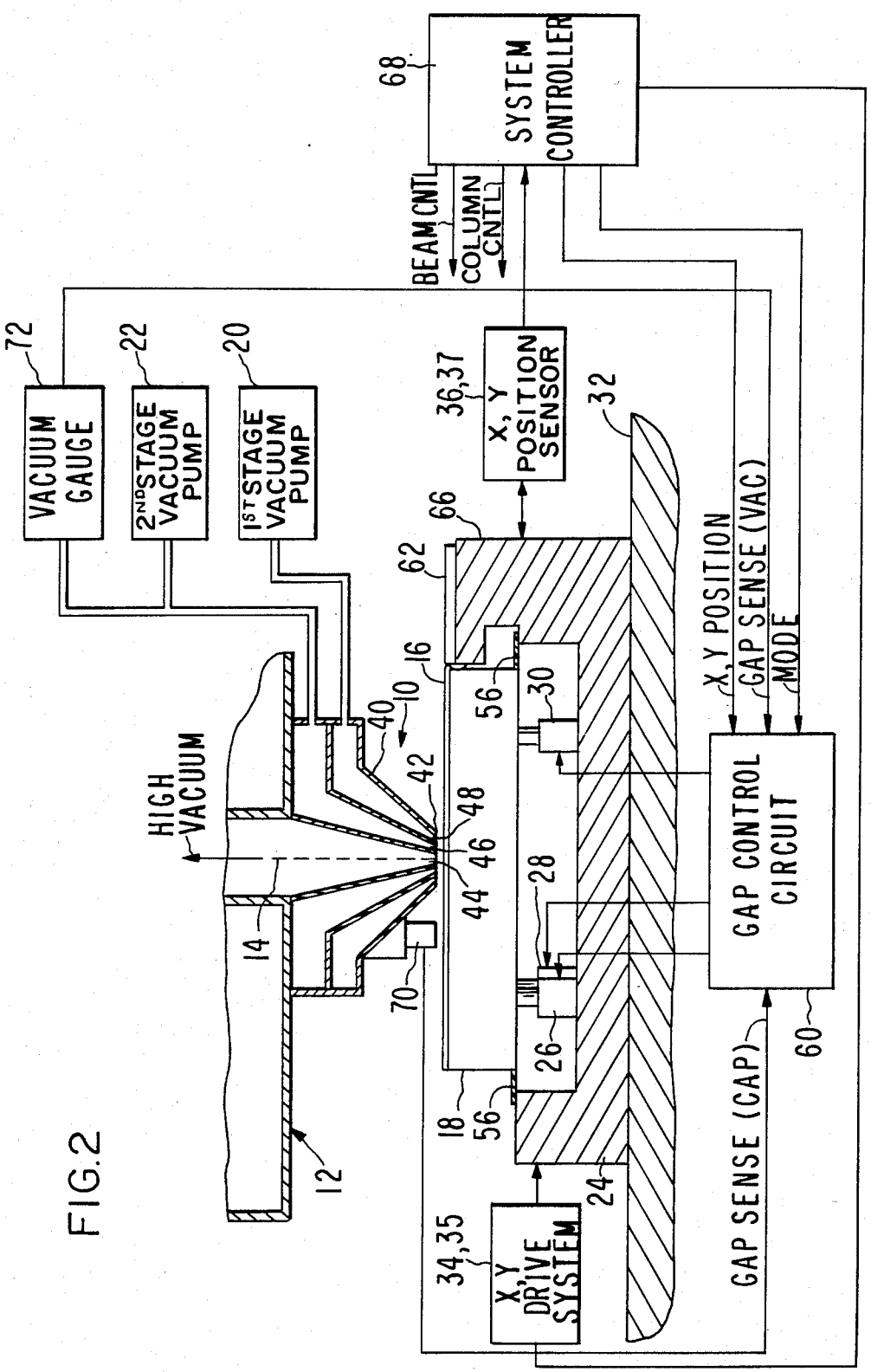
FIG. 2 is a block diagram illustrating a gap control apparatus for the system of FIG. 1.

The envelope apparatus 10, the stage 24 and apparatus for controlling the gap between the envelope apparatus 10 and the wafer 16, are illustrated in FIG. 2. The envelope apparatus 10 includes an envelope 40 which can be conical in shape and includes a generally planar tip 42. The tip 42 is positioned during processing slightly above the wafer 16. A gap, typically on the order of about 30 microns, is defined between the tip 42 and the surface of the wafer 16. The envelope 40 defines a vacuum processing zone 44 on the surface of the wafer 16. A differential pumping arrangement forms during operation a graded vacuum seal between the vacuum zone 44 and the ambient environment. The tip 42 includes annular apertures 46, 48 concentric with the vacuum zone 44. The annular aperture 48 is coupled to the first stage vacuum pump 20 which reduces the pressure around the vacuum zone 44 to a low vacuum level.

The annular aperture 46 is coupled to the second stage vacuum pump 22 which reduces the pressure around the vacuum zone 44 to an intermediate vacuum level. The vacuum zone 44 is coupled directly to the vacuum region of the electron beam column 12 and is pumped to high vacuum by the vacuum pump 17. Depending on the pressure required in a particular process, more or fewer vacuum pumping stages can be utilized to form the graded seal. To increase the vacuum conductance to the pump 17 and thereby further reduce the pressure in the vacuum zone 44, a direct connection can be made between the vacuum zone 44 and the vacuum pump 17. When the tip 42 of the envelope apparatus 10 is placed in close proximity to the surface of the wafer 16, a high vacuum is maintained in the vacuum zone 44, as the envelope apparatus moves over the surface of the wafer 16. The electron beam is scanned over a region of the wafer surface within the vacuum zone 44. Additional information on the localized envelope apparatus 10 is given in pending application Ser. No. 435,179.

The vacuum chuck 18 holds the wafer in a fixed lateral position with respect to the stage 24. Vacuum chucks are generally known for holding semiconductor wafers and have the advantage that physical contact is made at the rear of the wafer where damage is less likely. The vacuum chuck 18 must hold the wafer 16 flat during processing and must not permit any movement of the wafer 16. A suitable vacuum chuck includes a plurality of small pins surrounded by a rim which forms a vacuum seal with the wafer. The pins are coplanar with the top surface of the rim. When the volume behind the wafer is evacuated, the wafer is drawn into contact with the pins and thus flattened. Such a vacuum chuck is described by Saunders in "Wafer Flatness Utilizing the Pin-Recess Chuck," Solid State Technol., May 1982, p. 73, and in U.S. Pat. No. 4,213,698 issued Jul. 22, 1980 to Firtion et al. To prevent lateral movement, the vacuum chuck 18 includes a flexible ring 56 around its outer periphery. The flexible ring 56 is coupled to the stage 24 so as to permit a small amount of vertical, or z-axis, motion of the vacuum chuck 18, but to prevent any lateral movement in the xy plane. Inadvertent lateral displacement of the vacuum chuck 18 relative to laser mirrors integral to the stage 24 would result in an error in the xy position of the wafer 16 during processing.

A film of air forms an air bearing between the stage 24 and the planar surface 32 and provides relatively frictionless and particulate free movement of the stage 24 over the surface 32. The air bearing can be in the form of a plurality of small holes in either the stage 24 or the surface 32. Air is pumped through each of the holes at a constant rate so as to provide a cushion of air between the two surfaces. The actuators 26, 28, 30 provide a small amount of z-axis motion of the vacuum chuck 18 and can be independently controlled. The actuators 26, 28, 30 are controlled by a gap control circuit 60, as described hereinafter. An alignment pad 62 is mounted to the stage 24 and has a top surface which is coplanar with the top surface of the wafer 16. During setup of the system and when wafers are being exchanged, the tip 42 of the envelope apparatus 10 is positioned over the alignment pad 62. The alignment pad 62 typically includes fiducial marks (not shown) for measurement and adjustment of the electron beam 14, prior to electron beam exposure of the wafer 16. Alternatively, a Faraday cup with an alignment grid can be provided for beam adjustment. However, when the envelope apparatus 10 is positioned over the Faraday cup, the air contained therein causes a temporary degradation of vacuum in the vacuum zone 44. The alignment pad 62 permits wafers to be exchanged without breaking vacuum in the envelope apparatus 10. The drive system 34, 35 can be any suitable, highly precise xy positioning system. A suitable drive system 34, 35 employs linear motors, as described in pending application Ser. No. 435,178 filed concurrently herewith and assigned to the assignee of the present invention. Another suitable drive system 34, 35 employs x and y drive motors coupled to the stage 24 by an arrangement of ball screws, as is known in the art. Since the stage 24 is not in vacuum, no bellows or other vacuum interface is required. The lateral position of the stage 24 is precisely sensed by the laser interferometers 36, 37, which direct laser beams at mirrors 66 polished on two perpendicular surfaces of the stage 24, as described in U.S. Pat. No. 4,280,054. The output signals from the laser interferometers 36, 37. are fed to a system controller 68 which is typically a computer. The system controller 68 monitors the position of the stage 24 and sends control signals to the drive system 34, 35 which continuously positions the wafer 16 for electron beam exposure. The use of laser interferometers to monitor the xy position of a movable stage is disclosed in U.S. Pat. No. 4,063,103 issued Dec. 13, 1977 to Sumi.

The gap between the tip 42 of the envelope apparatus 10 and the surface of the wafer 16 is measured by one or more gap sensors on a continuous basis and is dynamically controlled so as to maintain a required gap dimension or range of allowed dimensions. As noted hereinabove, physical contact between the tip 42 and the wafer 16 is highly likely to damage the microminiature devices on the surface of the wafer 16 or to crack the wafer material. Conversely, if the gap becomes too large, the pressure in the vacuum zone 44 increases due to increased air flow through the gap and becomes too high to carry on electron beam exposure of the wafer 16. A capacitive gap sensor 70 is mounted on the envelope 40 as close to the tip 42 as possible and directed at the wafer 16. A vacuum gauge 72 is coupled to the second stage of the differential pumping arrangement surrounding the vacuum zone 44 and is used in a novel manner to sense the gap between the tip 42 and the surface of the wafer 16, as described hereinafter. The outputs of the capacitive gap sensor 70 and the vacuum gauge 72 are coupled to the gap control circuit 60 and provide signals corresponding to the instantaneous measured gap for control purposes.

Various types of gap sensors can be utilized in the system of FIGS. 1 and 2, depending on the required speed of operation and the type of vacuum processing being performed. The gap sensor must be non-contacting to avoid damage to the surface of the wafer 16. In the case of electron beam lithography, the gap sensor must have a quick response time to sense wafer surface variations during translation of the stage 24. In addition, the gap sensor must be sufficiently sensitive to detect gap variations of a few microns. Capacitive gap sensors provide good resolution and fast response time. The capacitive gap sensor 70 can be a Lion Precision Corp. Part No. PX305KM. Other suitable types of gap sensors include optical sensors, eddy current sensors and air micrometers or gauges. Optical sensors require a uniformly reflective workpiece surface to achieve accurate measurement. Eddy current sensors require a conductive workpiece. Air gauges have good resolution but have a relatively slow response time. A non-contacting air gauge system is sold by K Products, Inc., 453 Beacon St., Boston, Mass. A differential air servo system for controlling the position of a workpiece is described in U.S. Pat. No. 3,194,055, issued July 13, 1965 to Knobel. The position of the workpiece is sensed by an air gauge.

In a preferred embodiment, the vacuum gauge 72 is used as a gap sensor. It has been observed that as the gap between the tip 42 and the wafer 16 increases, the pressure in the second stage of the envelope apparatus 10 increases; and as the gap decreases, the pressure in the second stage decreases. Thus, the pressure in the second stage of the envelope apparatus 10 is directly related to the gap dimension. While the pressure does not necessarily vary linearly with gap, linearity is not required in the gap control system of the present invention. It will be understood that similar pressure variations occur in stages one and three of the envelope apparatus 10 as the gap varies. However, the pressure level in the second stage is most compatible with available vacuum gauges and demonstrates the greatest sensitivity to gap changes. The advantage of using the vacuum gauge 72 for gap measurement is that the gap is measured in an annular ring directly adjacent to the vacuum zone 44, the point at which the gap measurement is important. Other types of gap sensors are necessarily mounted a further distance away from the vacuum zone 44, thus giving rise to the possibility of a difference in gap between the point of measurement and the vacuum zone 44. In addition, the vacuum gauge 72 is operative as a gap sensor whenever the envelope apparatus 10 is over the wafer 16. By contrast, when a gap sensor such as a capacitive gap sensor is spaced from the tip 42, it can be off the edge of the wafer and useless for gap sensing even though the envelope apparatus 10 is in operating position over the wafer 16. Furthermore, because the gap is measured very close to the vacuum zone 44, where electron beam exposure is taking place, the gap measurement, as indicated by the vacuum gauge 72, can be used to dynamically control the focus of the electron beam column 12 as well as to control the gap. A suitable vacuum gauge 72 is a capacitive manometer vacuum gauge such as MKS Instruments Inc., Part No. 222BHS-A-0.5%-10.

An example of the actuators 26, 28, 30 is shown in FIG. 3. The actuator must be capable of providing rapid and very precise movement. The required travel is typically very small, on the order of 0.005 inch. In the example of FIG. 3, a piezoelectric element 76, such as as a Burleigh type PZ-44, converts an electrical signal on the order of 1,000 volts to linear mechanical motion. A micropositioning stage driven by a piezoelectric element is described by Scire at al in "Piezodriven 50 μm Range Stage with Subnanometer Resolution," Rev. Sci. Instrum., 49(12), Dec. 1978, p. 1735. The piezoelectric element 76 is mounted at one end to a support bracket 78. The opposite end of the element 76 bears against one arm of a lever 80. The other arm of the lever 80 is coupled through a pin 82 to the vacuum chuck 18. The lever 80 pivots about a flexible web 84 connecting the lever 80 to a support block 86. The material of the flexible web 84 can be beryllium copper. The lengths of the arms of the lever 80 can be designed to provide the required amount of z-axis motion. The support block 86 and the support bracket 78 are mounted to the stage 24. When the piezoelectric element 76 is energized by an electrical signal, it increases or decreases in length. The change in length is converted by the lever 80 into vertical, or z-axis, movement of the vacuum chuck 18. Alternatively, a Burleigh "inch worm" piezoelectric element can be utilized.

The configuration of three actuators 26, 28, 30 shown in FIG. 3 provides the capability to raise and lower the wafer 16 along the z-axis by energizing each of the actuators 26, 28, 30 in parallel and equally. In addition, by energizing the actuators 26, 28, 30 unequally, more complex movements of the wafer 16 can be accomplished. The orientation of the plane of the wafer 16 can be varied in this way, since the positions of the three actuators 26, 28, 30 define the plane of the wafer 16. A configuration with one or two actuators can be used when adjustment of the parallelism of the wafer 16 with respect to the tip 42 is not required. A configuration with more than three actuators can also be used both to raise and lower and to vary the plane of the wafer 16.

The gap control circuit 60 processes the gap sense signals from the capacitive gap sensor 70 or the vacuum gauge 72 and provides control signals to the actuators 26, 28, 30, so as to continuously maintain a required gap dimension or range of gap dimensions between the tip 42 of the envelope apparatus 10 and the wafer 16. A block diagram of the gap control circuit 60 is shown in FIG. 4. A sensor select circuit 100, which can be an analog gating circuit, selects the signal from either the capacitive gap sensor 70 or the vacuum gauge 72, depending on the mode of operation. Typically, the signal from the capacitive gap sensor 70 is used to determine the position of the wafer before moving the wafer under the envelope apparatus, while the signal from the vacuum gauge 72 is used both in the setup mode and in the run mode. The capacitive gap sensor 70 is thus used as an auxiliary gap sensor for initial setup purposes. The selected gap sense signal is compared in a summing circuit 102 with a signal representing the required gap to provide an error signal corresponding to the difference between the measured gap and the required gap. The error signal is coupled to actuator control circuits 104, 106, 108. The actuator control circuits 104, 106, 108 also receive inputs from a gain control circuit 110 which is operative to provide independent control of each of the actuator control circuits 104, 106, 108. The outputs of the actuator control circuits 104, 106, 108 are coupled through actuator drivers 112, 114, 116, respectively, to the actuators 26, 28, 30. The actuator control circuits 104, 106, 108 function to scale the magnitude of the error signal to an appropriate level. The scaling, or gain control, is provided by the gain control circuit 110. The actuator drivers 112, 114, 116 function as interface circuits to the actuators 26, 28, 30.

Figure 5A:
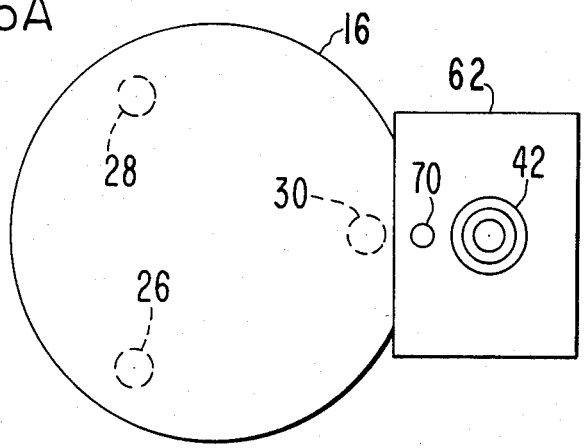
FIGS. 5A and 5B illustrate the procedure for initial positioning of a workpiece relative to the envelope apparatus of FIG. 2.

In operation of the system of FIGS. 1-4, the stage 24 is initially positioned so that the tip 42 of the envelope apparatus 10 and the capacitive gap sensor 70 are above the alignment pad 62, as shown in FIG. 5A. At this time, the electron beam 14 is adjusted to provide the proper focus by utilizing the fiducial marks on the alignment pad 62. The alignment pad 62 is a rest position for the envelope apparatus 10 and insures that vacuum is not broken in the envelope apparatus 10 during exchange of wafers. In addition, the alignment pad provides a stable standard for system setup and is used as a reference for initial positioning of the wafer. During the measurement and adjustment of the electron beam 14, a wafer is introduced onto the vacuum chuck 18 by the automatic wafer handling system 17.

Figure 5B:
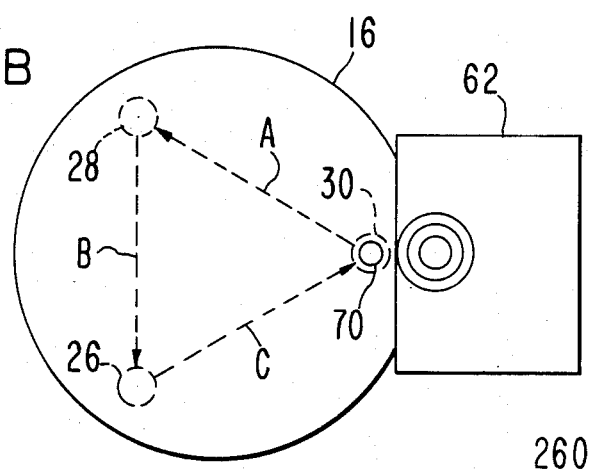

While the wafer 16 is positioned as close as possible to the required position with respect to the envelope apparatus 10 and the alignment pad 62, variations between individual wafers may necessitate an initial adjustment or setup procedure using the actuators 26, 28, 30. First, the stage 24 is moved so that the capacitive gap sensor 70 is above the edge of the wafer 16, but the tip 42 of the envelope apparatus 10 is still located above the alignment pad 62, as shown in FIG. 5B. The vertical position of the wafer 16 is sensed by the capacitive gap sensor 70. Referring again to FIG. 4, the sensor select circuit 100 selects the capacitive gap sense signal, and the summing circuit 102 provides an error signal representative of the difference between the measured gap and the required gap. The gain control circuit 110 receives x position and y position signals from the system controller 68, indicating that the sensor 70 is positioned above the edge of the wafer 16 and the envelope apparatus 10 is above the alignment pad 62. The actuators 26, 28, 30 are energized in parallel by equal control signals, and the wafer 16 is moved up or down until the measured gap agrees with the required gap and the error signal is zero.

After this adjustment of the wafer 16, the top surface of the wafer 16 adjacent the alignment pad 62 is coplanar within allowable limits with the top surface of the alignment pad 62, and the wafer 16 can be moved under the tip 42 of the envelope apparatus 10 without contacting the tip 42 or breaking vacuum. However, the remainder of the wafer 16 remains to be aligned with respect to the tip 42. Although the edge of the wafer 16 adjacent the alignment pad 62 has been properly positioned, the plane of the wafer 16 can be inclined at an unknown angle with respect to the xy plane which is parallel to the plane of stage translation and the plane of the tip 42. To bring the wafer 16 into parallelism with the plane of translation and the tip 42 and to the required gap, the wafer 16 is moved with respect to the envelope apparatus 10 in a pattern indicated by the dotted lines A, B, C in FIG. 5B. During this part of the procedure, it is preferred that the vacuum gauge 72 be utilized for gap sensing, although the capacitive gap sensor 70 can be used. Path A traverses a line between the actuator 30 and the actuator 28. As Path A is traversed, the gap is monitored, and the gain control circuit 110 enables the actuator control circuit 106. The actuator 28 is energized and raises or lowers the portion of the wafer 16 thereabove so as to maintain the required gap. Similarly, the Path B traverses a line between the actuator 28 and the actuator 26. As this path is traversed, the actuator control circuit 104 is enabled, and the actuator 26 raises or lowers the wafer 16 so as to maintain the required gap. Path C traverses a line between the actuator 26 and the actuator 30. As this path is traversed, the actuator 30 can be energized to provide further fine adjustments of the position of the wafer 16. At this time, the entire surface of the wafer 16 should be parallel with the plane of the tip 42 and spaced by the required gap, except for localized variations in the surface of the wafer. If necessary, the Paths A, B, C can again be traversed to check the positioning of the wafer 16 and make further fine adjustments. It will be understood by those skilled in the art that, depending on the required pattern accuracy, the required vacuum level for processing, the accuracy of the wafer handling system and the precision of the wafers, the above setup procedure may or may not be required. It will further be understod that for larger or smaller wafers, the Paths A, B, C do not necessarily pass directly over the actuators 26, 28, 30. Any triangular path is suitable.

During exposure of the wafer 16 by the electron beam 14, the stage 24 is moved by the drive system 34, 35 back and forth beneath the envelope apparatus 10, in a prescribed pattern that eventually covers the entire surface of the wafer 16. The stage 24 is typically moved continuously to avoid the overhead times associated with starting and stopping. However, it will be realized that the system can be operated in a step-and-repeat mode in which the stage 24 is moved intermittently. During lateral motion of the stage 24 and the wafer 16, it is necessary to dynamically control the gap between the tip 42 and the wafer 16 for the reasons described hereinabove. During electron beam exposure, it is preferred to use the vacuum gauge 72 for gap sensing. Thus, the vacuum gap sense signal is selected by the sensor select circuit 100. It is assumed during normal operation that the wafer 16 remains in parallel alignment with the tip 42 after the initial alignment procedure. Therefore, the actuators 26, 28, 30 are energized equally; and the entire plane of the wafer 16 is moved upward or downward as required to compensate for gap variations caused by localized irregularities on the surface of the wafer 16. Thus, the gain control circuit 110 provides equal gain control signals to each of the actuator control circuits 104, 106, 108.

While the gap control circuit described hereinabove compares the gap sense signal with a fixed-value required gap, it will be understood that in some applications a range of gap dimensions can be tolerated, for example, 20 $\mu$m to 40 $\mu$m. In this case, the gap sense signal is compared with upper and lower limits, and the actuators 26, 28, 30 are energized when the measured gap is outside these limits. Furthermore, it is desirable to limit the allowable travel of the actuators 26, 28, 30 to avoid contact between the tip 42 and the wafer 16 and to avoid breaking vacuum when, for example, the control circuit 60 malfunctions or the wafer is chipped. When a travel limit is reached, an alarm signal can be sent to the controller 68 and corrective action can be taken.

Figure 6:
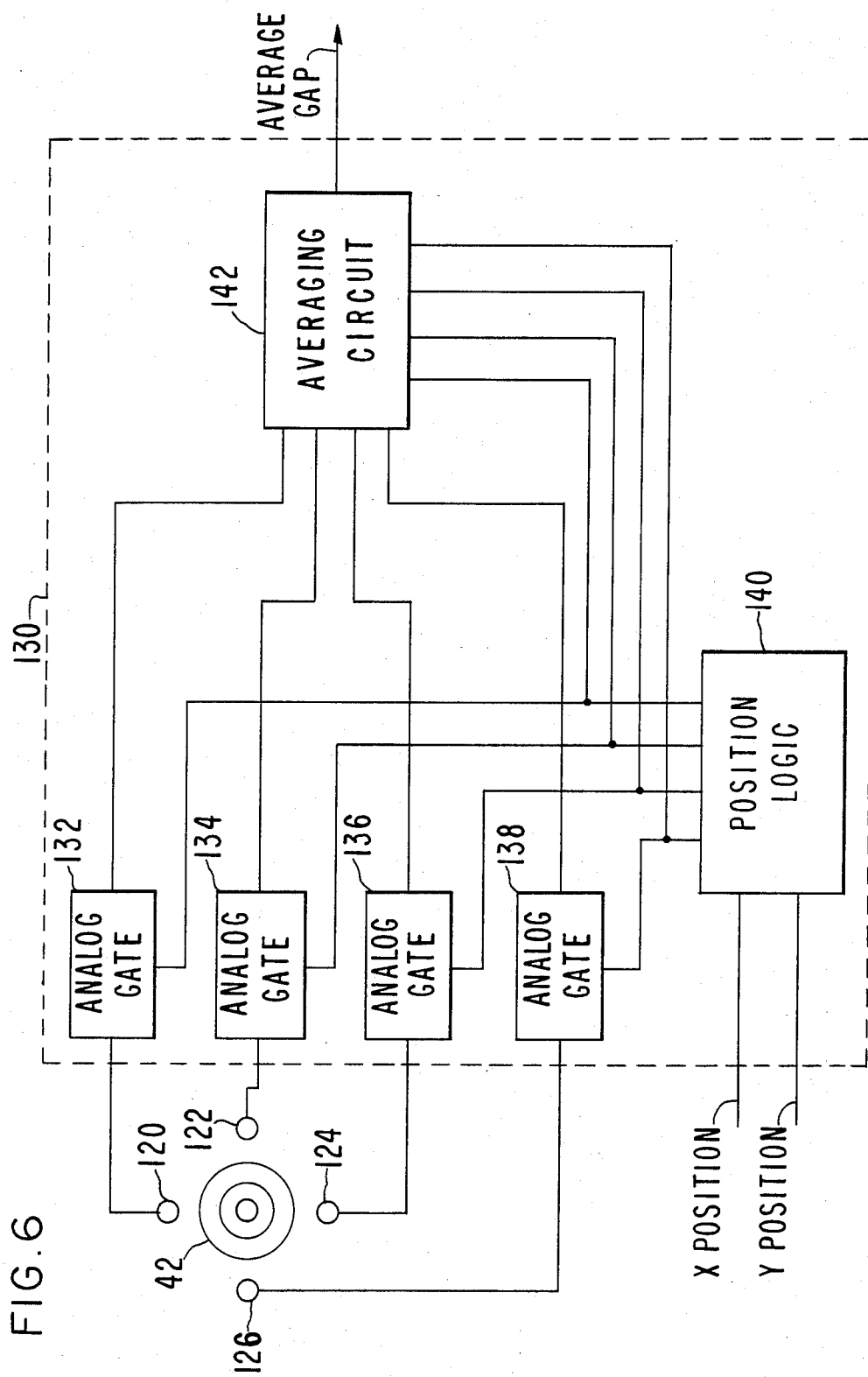
FIG. 6 is a block diagram illustrating another embodiment of gap control apparatus in accordance with the present invention.

An alternative embodiment for gap sensing and control is illustrated in block diagram form in FIG. 6. Gap sensing is accomplished by capacitive gap sensors 120, 122, 124, 126 positioned at 90 degree intervals around the tip 42 of the envelope apparatus 10. A top view of such an arrangement is shown in FIG. 6. Each of the capacitive gap sensors 120, 122, 124, 126 individually senses the gap between the tip 42 and the wafer 16 and provides a gap sense signal. Depending on the orientation and surface contour of the wafer 16, the four gap sense signals may or may not be equal. The gap sense signals from the gap sensors 120, 122, 124, 126 can be processed in various ways to control the actuators 26, 28, 30. An example of such processor is illustrated in FIG. 6. A sensor processor 130 includes analog gates 132, 134, 136, 138 which receive gap sense signals from the gap sensors 120, 122, 124, 126, respectively. The analog gates 132, 134, 136, 138 are controlled by the outputs of a position logic circuit 140 which operates as described below. The outputs of the analog gates 132, 134, 136, 138 are connected to an averaging circuit 142 which calculates an average value of the gap between the tip 42 and the wafer 16. The outputs of the position logic circuit 140 are also connected to the averaging circuit 142. The position logic circuit 140 receives x and y position information from the system controller 68.

Referring again to FIG. 4, the sensor select circuit 100 is replaced in the present embodiment by the sensor processor 130 of FIG. 6. The average gap signal from the sensor processor 130 is coupled to the summing circuit 102 of FIG. 4, which calculates an error signal as described hereinabove.

In operation, the embodiment of FIG. 6 can employ the same initial setup procedure described hereinabove in connection with FIGS. 1-5, except that the gap sensors 120, 122, 124, 126 perform all gap sensing. The alignment pad 62 is positioned under the tip 42 during the exchange of wafers. Then the wafer 16 is positioned under the tip 42 and the Path A, B, C, as illustrated in FIG. 5B, is traversed. The gap sensors 120, 122, 124, 126 monitor the gap, and the wafer is dynamically positioned so as to establish parallelism between the wafer 16 and the tip 42 and to establish the required gap.

During normal operation, the capacitive gap sensors 120, 122, 124, 126 monitor the gap as the wafer 16 is moved back and forth under the envelope apparatus 10. When the central portion of the wafer 16 is being exposed, all of the gap sensors 120, 122, 124, 126 are over the wafer 16. However, it will be realized that when the edge of the wafer 16 is being exposed, one or two of the gap sensors 120, 122, 124, 126 will be off the edge of the wafer 16. Gap sense signals from any of the gap sensors not over the wafer 16 should be ignored in the averaging process. The position logic circuit 140 determines the relative positions of the tip 42 and the wafer 16 and enables appropriate ones of the analog gates 132, 134, 136, 138. The position logic circuit 140 can be in the form of threshold detection circuits. Thus, for example, when the x position exceeds a given positive value, the appropriate analog gate is inhibited, and the corresponding sensor signal is gated off. Additional threshold detection circuits detect negative values of x and positive and negative values of y so as to enable only the capacitive gap sensors which are positioned above the wafer 16. The outputs of the position logic circuit 140 control the averaging circuit 142 so that the averaging process is based on the correct number of input sensor signals.

It will be realized by those skilled in the art that other sensing arrangements can be utilized. For example, a larger or smaller number of capacitive gap sensors can be utilized. Also, gap sensors of various shapes, for example annular, can be used. Two capacitive gap sensors can be positioned on opposite sides of the tip 42. Also, in a simpler embodiment, only one capacitive gap sensor at a time is enabled, thereby eliminating the requirement for averaging. In a more complex embodiment, each of the gap sensor signals can be individually processed to obtain a dynamic measurement of parallelism as well as gap. When unequal gap measurements are obtained, the actuators 26, 28, 30 are energized so as to correct the parallelism of the wafer 16 with respect to the tip 42, as well as the gap therebetween. Similarly, other types of gap sensors can be positioned around the tip 42, as shown in FIG. 6.

An alternative embodiment of apparatus for localized vacuum processing of a workpiece is illustrated in schematic form in FIG. 7. The apparatus includes a localized vacuum processing envelope apparatus 210 coupled through a bellows 211 to the output of a particle beam source, such as an electron beam column 212, which corresponds to the column 12 described hereinabove. An electron beam 214 passes through the envelope apparatus 210 and impinges on a semiconductor wafer 216. The wafer 216 is supported and held in position by a vacuum chuck 218 which in turn is mounted on a stage 224. The stage 224 is movably supported by an air bearing on a planar surface 232 and is translated over the surface 232 by a drive system 234.

The envelope apparatus 210 is generally similar in construction and operation to the envelope apparatus 10 shown in FIGS. 1 and 2 and described hereinabove. The envelope apparatus 210 differs from the envelope apparatus 10 in that it is movable with respect to the electron beam column 212 and includes a pivot arm 236. The envelope apparatus 210 includes a generally conical envelope 240 and a generally planar tip 242. The envelope 240 defines a vacuum processing zone 244 on the surface of the wafer 216. The envelope apparatus 210 includes annular apertures concentric with the vacuum zone 244 which are vacuum pumped through the pivot arm 236 by vacuum pumps 250, 252. The vacuum zone 244 is coupled to the high vacuum region of the electron beam column 212 and is sealed thereto by the bellows 211. The envelope apparatus 210 operates the same as the envelope apparatus 10 described hereinabove to provide high vacuum in the vacuum zone 244. The envelope apparatus 210 pivots about a pivot point 254 so as to permit a small amount of substantially vertical movement. The envelope apparatus 210 is controlled in its movement about the pivot point 254 by an actuator 258.

The vacuum chuck 218 operates the same as the vacuum chuck 18, shown in FIG. 1 and described hereinabove, to hold the wafer in a fixed position from its rear surface. The vacuum chuck 218 is rigidly mounted to the stage 224. An alignment pad 262 is mounted to the stage 224 and has a top surface which is coplanar with the top surface of the wafer 216. The drive system 234 can be any suitable highly precise xy positioning system, as described hereinabove in connection with the drive system 34, 35. The lateral position of the stage 224 is sensed by a laser interferometer 264 which directs a laser beam at mirrors 266 polished on two perpendicular surfaces of the stage 224. Output signals from the laser interferometer 264 are fed to a system controller 268 which monitors the position of the stage 224 and sends control signals to the drive system 234.

The importance of maintaining a prescribed gap between the tip 242 of the envelope apparatus 210 and the surface of the wafer 216 has been discussed hereinabove. In the embodiment of FIG. 7, the initial z-axis position of the wafer 216 is sensed by a capacitive gap sensor 270 mounted on the envelope 240 as close to the tip 242 as possible and directed at the wafer 216. A vacuum gauge 272 is coupled to the second stage of the graded seal surrounding the vacuum zone 244 and is used to sense the gap in the same manner as the vacuum gauge 72 described hereinabove. The outputs of the capacitive gap sensor 270 and the vacuum gauge 272 are coupled to a gap control circuit 260 and provide signals corresponding to the instantaneous measured gap. The output of the gap control circuit 260 is a control signal which energizes the actuator 258 and causes the envelope apparatus 210 to move up or down so as to maintain the required gap.

The capacitive gap sensor 270 and the vacuum gauge 272 can be the same as the gap sensors described hereinabove in connection with FIG. 2, or suitable alternative gap sensors can be utilized. The actuator 258 can utilize a piezoelectric element as shown in FIG. 3. An example of the gap control circuit 260 is shown in block diagram form in FIG. 8. One of the gap sense signals is selected by a sensor select circuit 290, according to the mode of operation of the system. The selected gap sense signal is compared with a signal representing the required gap in a summing circuit 292 to produce an error signal representative of the difference therebetween. The error signal is scaled to an appropriate level by an actuator control circuit 294. The output of the actuator control circuit 294 is connected through an actuator driver 296 to the actuator 258.

Figure 8:
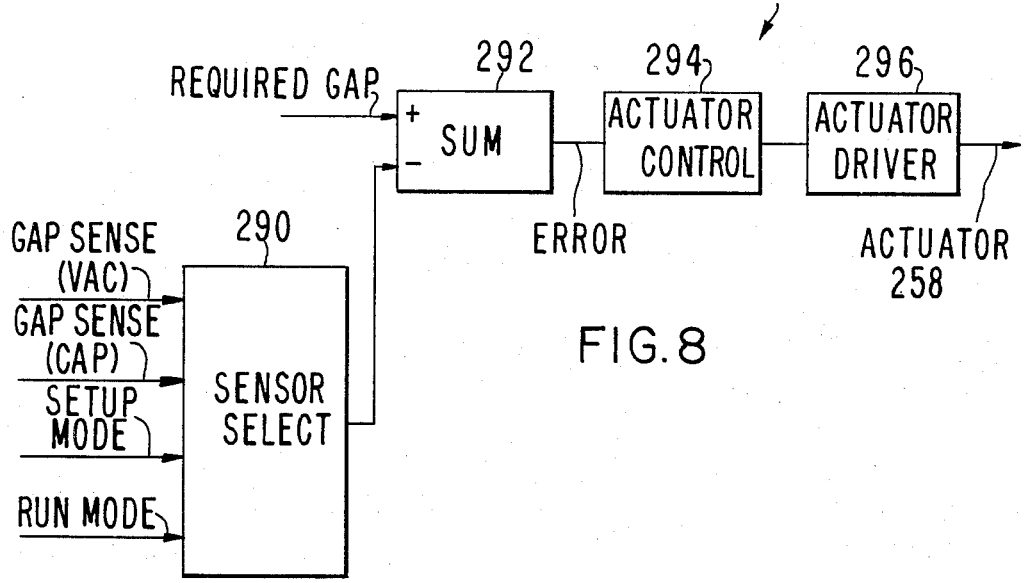
FIG. 8 is a block diagram of the gap control circuit shown in FIG. 7.

In operation of the system of FIG. 7, the stage 224 is initially positioned so that the tip 242 of the envelope apparatus 210 and the capacitive gap sensor 270 are above the alignment pad 262. The electron beam 214 is focused by utilizing fiducial marks on the alignment pad 262. During this time, a wafer is introduced onto the vacuum chuck 218 by an automatic wafer handling system. To sense that the wafer 216 has been positioned coplanar or nearly coplanar with the top surface of the alignment pad 262, the stage 224 is moved so that the capacitive gap sensor 270 is above the edge of the wafer 216, and the tip 242 of the envelope apparatus 210 is above the alignment pad 262. The position of the wafer 216 is sensed by the gap sensor 270. Referring to FIG. 8, the capacitive gap sense signal is selected by the sensor select circuit 290 and is fed to the summing circuit 292. The measured gap is compared with the required gap by the summing circuit 292, and an error signal representative of the difference is provided to the actuator control circuit 294. The actuator control circuit 294 scales the error signal to the appropriate level and provides an output signal through the actuator driver 296 to the actuator 258. In this way, the tip 242 is raised or lowered by a small amount to compensate for slight differences in level between the wafer 216 and the alignment pad 262. However, the tip 242 cannot be raised so much that the vacuum is broken. The stage 224 can then be moved so that the tip 242 is able to cross the small space between the alignment pad 262 and the wafer 216 without substantial loss of vacuum. When the wafer 216 is not properly positioned with respect to the alignment pad 262, it can be repositioned by the wafer handling system or can be replaced. Alternatively, the system can be provided with means for causing relative vertical movement between the wafer 216 and the alignment pad 262.

After the stage 224 has been moved so that the tip 242 is over the wafer 216, normal electron beam exposure of the wafer 216 can proceed. The stage 224 is moved by the drive system 234 back and forth beneath the envelope apparatus 210 in a prescribed pattern that eventually covers the entire surface of the wafer 216. During lateral motion of the stage 224 and the wafer 216, the gap between the tip 242 and the wafer 216 is dynamically controlled. As noted hereinabove, utilization of the vacuum gauge 272 is preferred for gap sensing during normal operation. The gap sense signal from the vacuum gauge 272 is selected by the sensor select circuit 290 and is provided to the summing circuit 292, which compares the gap sense signal with the signal representing the required gap. The error signal from the summing circuit 292 is scaled by the actuator control circuit 294 and is provided through the actuator driver 296 to the actuator 258. The actuator 258 moves the envelope apparatus upward or downward as required to maintain the required gap between the wafer 216 and the tip 242. In effect, the tip 242 of the envelope apparatus 210 tracks over the surface of the wafer 216, and follows variations and irregularities in the wafer surface.

In the embodiment of FIG. 7, the tip 242 of the envelope apparatus 210 follows the surface of the wafer 216 to maintain the required gap therebetween. However, the wafer 216 is fixed in vertical position with respect to the electron beam column 212. Therefore, irregularities and variations in the surface of the wafer 216 cause variations in the distance between the electron beam column 212 and the wafer surface being exposed by the electron beam 214. Electron beam columns for high precision lithography can have a short depth of focus, on the order of a few microns. When the variations in the surface of the wafer 216 exceed this amount, dynamic focus corrections must be applied to the electron beam column 212 as the stage 224 and the wafer 216 are moved back and forth beneath the tip 242. The required focus correction can be determined by utilizing a gap sensor 273 which monitors the position of the envelope apparatus 210, with respect to the electron beam column 212. Since the envelope apparatus 210 tracks the surface of the wafer 216, the position of the envelope apparatus 210 indicates the position of the wafer surface at that location.

In another configuration of the system of FIG. 7, the gap sensor 270, the vacuum gauge 272, the gap control circuit 260 and the actuator 258 are omitted. The outer periphery of the tip 242 of the envelope apparatus 210 includes a plurality of equally spaced holes, each of which is connected to a source of air under pressure. The air is forced out through the holes into the gap between the tip 242 and the wafer 216 and forms an air bearing therebetween. A portion of the air escapes outward to the external environment, while the remainder of the air is removed by the vacuum pumping system of the envelope apparatus 210. The airflow through the holes is adjusted so that the tip 242 is spaced above the surface of the wafer 216 by the required gap. Thus, as the wafer 216 is moved beneath the tip 242, the envelope apparatus 210 rides on a cushion of air at the required gap above the wafer 216 and follows variations in the surface.

Thus, there is provided by the present invention apparatus for controlling the gap between the tip of a localized vacuum processing envelope apparatus and a workpiece so as to prevent degradation of the vacuum level in the envelope apparatus and to prevent contact between the envelope apparatus and the workpiece. The apparatus has the capability to control not only the spacing between the tip of the envelope apparatus and the workpiece but also the orientation of the plane of the workpiece with respect to the envelope apparatus. In addition, there is provided a method for sensing the gap by measuring the pressure at a specified location in the gap.

While there has been shown and described what is at present considered the preferred embodiments of the invention, it will be obvious to those skilled in the art that various changes and modifications may be made therein without departing from the scope of the invention as defined by the appended claims.

What is claimed is:

1. Charged particle beam lithography apparatus for treating a semiconductor wafer or mask workpiece surface comprising a vacuum envelope having an aperture, a charged particle beam source located in the vacuum envelope for deriving a charged particle beam that is directed through the aperture as a treating beam for the workpiece surface, means for maintaining only a portion of the workpiece surface in approximate registration with the aperture in a vacuum such that the beam can propagate from the source to the workpiece surface portion exclusively in a vacuum, said maintaining means including: (a) means for holding the workpiece so that all of the workpiece, except said workpiece surface portion, is in an ambient environment not subjected to the vacuum; (b) means for preventing contact between the envelope and the workpiece so that a gap is formed between the workpiece surface and the envelope whereby the workpiece surface can move generally transversely of the beam propagation direction to enable different portions of the workpiece surface to be treated in vacuo by the beam at differing times, and (c) vacuum pump means forming a vacuum seal in the gap for minimizing degradation of the vacuum through the gap; and said means for preventing contact including feedback means for controlling the length of the gap to a predetermined range without contacting the workpiece, said feedback means including: means for sensing the length of the gap, and means responsive to a comparison of a gap length indicating signal derived by the sensing means and a set point value for gap length for dynamically controlling the gap length so it is within the predetermined range.

2. The apparatus of claim 1 wherein said vacuum seal forming means includes means for establishing a graded vacuum seal generally transversely of the beam propagation direction, the graded vacuum seal being formed in the gap.

3. The apparatus of claim 2 wherein said means for establishing the graded vacuum includes means for forming first and second chambers respectively having first and second generally annular openings surrounding the aperture such that the second opening surrounds the first opening and the first opening surrounds the aperture, means for maintaining vacuums in the first and second chambers so the first opening is at a vacuum pressure that is between a vacuum pressure of the envelope and a vacuum pressure of the second opening.

4. The apparatus of claim 1 wherein said contact preventing means includes means for forming an air bearing in the gap completely around the vacuum seal.

5. The apparatus of claim 1 wherein the workpiece is flexible so that it has a tendency to bow in response to a differential pressure commensurate with the pressure between atmospheric pressure and the pressure of the vacuum in the gap, the aperture area and the treated area in the gap being sufficiently small as to minimize the bowing tendency.

6. The apparatus of claim 1 wherein the contact preventing means includes means for maintaining the gap length in a range such that the amount of ambient air flowing through the gap is such that the registration maintaining means can maintain the treated workpiece portion in vacuo while preventing contact between the envelope and workpiece treated surface.

7. The apparatus of claim 1 further including means for moving the workpiece holding means relative to the aperture so that the workpiece surface moves generally transversely of the beam propagation direction.

8. The apparatus of claim 1 further including means for sensing the position of the workpiece relative to the envelope with respect to first and second co-ordinate values in a plane at right angles to the gap length, and wherein the means for dynamically controlling the gap length includes first, second and third position controllers responsive to the sensed gap length and the sensed workpiece position in a plane at right angles to the gap, each of said position controllers controlling the workpiece position in the direction of the gap at three spaced positions in the plane generally at right angles to the gap.

9. The apparatus of claim 8 wherein each of said position controllers includes a support surface for a horizontal surface of the workpiece opposite from the surface being treated, the support surface being translated at right angles to the horizontal surface.

10. The apparatus of claim 2 wherein said envelope includes a tip having a frusto-conical exterior wall, extending away from the remainder of the envelope toward the workpiece and toward the beam axis, the tip including a central passage defining the aperture and a concentric passage, the central and concentric passages having frusto-conical walls extending away from the remainder of the envelope toward the workpiece and toward the beam axis.

11. The apparatus of claim 3 wherein said envelope includes a tip having a frusto-conical exterior wall, extending away from the remainder of the envelope toward the workpiece and toward the beam axis, the tip including a central passage defining the aperture and first and second concentric passages, the central and concentric passages having frusto-conical walls extending away from the remainder of the envelope toward the workpiece and toward the beam axis.

12. The apparatus of claim 41 wherein said holding means includes a stage assembly positioned adjacent the aperture, said stage assembly includes means for forming a planar air bearing on a bottom, load bearing side of the stage assembly for facilitating lateral motion of said stage assembly.

13. The apparatus of claim 12 wherein the surface of said bottom, load bearing side contains a network of supply holes and grooves connected through channels to air supply means to thereby establish said planar air bearing in conjunction with a surface of a platen.

14. The apparatus of claim 1 wherein the holding means includes a stage assembly positioned adjacent the aperture, further including alignment pad means positioned on said stage assembly so it is coplanar with the surface of said workpiece and adjacent said workpiece means for moving said stage assembly so that during loading and off-loading of workpieces the assembly is in such a position that said vacuum envelope rests in spaced apart, closely coupled opposition over said pad thereby retaining the vacuum in said vacuum envelope during loading and off-loading.

15. The apparatus of claim 14 wherein said alignment pad includes fiducial marks to permit proper registration between an axis of said beam and said stage assembly.

16. The apparatus of claim 15 wherein said stage assembly includes an upper surface having a well so that the upper surface of the workpiece is coplanar with the surface of said stage whereby said surface of said stage functions as said alignment pad means.

17. The apparatus of claim 1 wherein said holding means includes a stage assembly positioned adjacent the aperture, said stage assembly including vacuum chuck means for holding said workpiece during lithographic processing.

18. The apparatus of claim 17 wherein said vacuum chuck means includes gas flow channels oriented in a direction such that when gas flows outwardly in the channels the gas flow causes the workpiece to move off and away from said vacuum chuck.

19. The apparatus of claim 18 wherein said gas flow channels are the same channels through which vacuum is communicated to said vacuum chuck.

20. The apparatus of claim 1 wherein the envelope includes a tip having a plane defining one side of the gap and further including alignment pad means having a surface located adjacent and coplanar with the workpiece surface, said alignment pad means being positioned relative to the tip so as to maintain vacuum in said vacuum envelope during exchange of workpieces.

21. The apparatus of claim 1 further including means for providing a curtain of gas at approximately atmospheric pressure completely surrounding the vacuum in the gap for substantially preventing atmospheric air and contaminants therein from entering the vacuum in the gap and envelope.

22. The apparatus of claim 1 wherein the envelope includes a tip having a plane defining one side of the gap, said aperture being formed in said plane, the tip including first and second passages, the first passage terminating in said aperture, the beam propagating through said first passage, the second passage terminating in said plane at a locus surrounding the aperture, the first passage being in direct fluid flow relation with the interior of the envelope so it is at approximately the same vacuum as the envelope interior, means for applying a vacuum to the second passage so the second passage is at a higher pressure than the first passage whereby a radial graded vacuum is formed in the gap by the vacuum pressures in the first and second passages, the cross sectional area of at least one of the passages increasing as distance in the passage increases from the plane.

23. A method of treating a workpiece surface with a charged particle beam that is directed through an aperture in a vacuum envelope onto the surface, comprising the steps of: (a) maintaining a first portion of the workpiece surface that is approximately in registration with the aperture in vacuo while maintaining the remainder of the workpiece surface in an ambient environment outside of the vacuum, (b) maintaining a gap between the aperture and the first portion of the workpiece surface while the first portion of the workpiece surface is being irradiated by the charged particle beam, the vacuum of step (a) being formed by using vacuum pump means to form a vacuum seal in the gap while the first portion of the workpiece surface is being irradiated by the charged particle beam, the gap and seal being such that the beam is exclusively in vacuo while propagating from the envelope to the first portion of the workpiece surface; moving the workpiece surface relative to the aperture so that a second portion of the workpiece surface that is approximately in registration with the aperture is in vacuo, the workpiece surface being moved relative to the aperture from the first portion to the second portion while maintaining a gap between the workpiece surface and the aperture and without breaking the vacuum seal between the workpiece surface and the vacuum envelope interior; repeating steps (a) and (b) for the second portion of the workpiece surface; and feedback controlling the length of the gap to a predetermined range, the feedback control being provided by: sensing the length of the gap while the first and second portions are irradiated by the charged particle beam and while there is movement of the workpiece surface relative to the aperture, and responding to a comparison of the sensed length and a set point value therefor to maintain the gap in the range while the first and second workpiece portions are being irradiated by the charged particle beam and while the workpiece surface is moving relative to the aperture between the first and second workpiece portions.

24. The method of claim 23 further including sensing the position of the workpiece relative to the envelope with respect to first and second co-ordinate values in a plane at right angles to the gap length, and dynamically controlling the gap length in response to the sensed gap length and the sensed workpiece position in the plane at right angles to the gap length by controlling the workpiece position in the direction of the gap at three spaced positions in a plane generally at right angles to the gap length while maintaining the workpiece surface aligned with the aperture in the vacuum established in the gap.

25. The method of claim 24 wherein the workpiece position is respectively controlled at the three spaced positions by first, second and third actuators, and controlling the actuators to stabilize the position of the treated workpiece surface in the plane at right angles to the gap length prior to the treated workpiece surface being irradiated and while the workpiece surface portion aligned with the aperture is maintained in the vacuum established in the gap.

26. The method of claim 25 wherein the initial stabilization is performed by translating the workpiece between the first, second and third actuators; as the workpiece is translated between the first and second actuators, controlling the position of the second actuator in response to the sensed gap length and the sensed workpiece position without changing the position of the first and third actuators, then as the workpiece is translated between the second and third actuators, controlling the position of the third actuator in response to the sensed gap length and the sensed workpiece position without changing the position of the first and second actuators, then as the workpiece is translated between the third and first actuators, controlling the position of the first actuator in response to the sensed gap length and the sensed workpiece position without changing the position of the second and third actuators.

27. The method of claim 25 wherein the workpiece position is controlled initially, prior to stabilization, by positioning the workpiece so an edge thereof is in a field of a sensor for the gap length and the envelope is in alignment with an alignment pad fixedly mounted with respect to a holder for the workpiece while maintaining the vacuum in the gap.

28. The method of claim 23 wherein the workpiece position is controlled initially by positioning the workpiece so an edge thereof is in a field of a sensor for the gap length and the envelope is in alignment with an alignment pad fixedly mounted with respect to a holder for the workpiece while maintaining the vacuum in the gap.

* * * * *